ered by the Secretary of the

United States Patent [19]
Tauber et al.

[11] Patent Number: 6,084,246
[45] Date of Patent: Jul. 4, 2000

[54] $A_4MESB_3O_{12}$ SUBSTRATES AND DIELECTRIC/BUFFER LAYERS FOR GROWTH OF EPITAXIAL HTSC/PEROVSKITE OXIDE FILMS FOR USE IN HTSC/PEROVSKITE OXIDE DEVICES AND MICROWAVE DEVICE STRUCTURES

[75] Inventors: Arthur Tauber, Elberon, N.J.; Steven C. Tidrow, Silver Spring, Md.; William D. Wilber, Neptune; Robert D. Finnegan, West Long Branch, both of N.J.

[73] Assignee: The United States of America as represented by the Secretary of the Army, Washington, D.C.

[21] Appl. No.: 09/371,166

[22] Filed: Aug. 10, 1999

Related U.S. Application Data

[63] Continuation-in-part of application No. 08/752,511, Nov. 20, 1996, abandoned.

[51] Int. Cl.[7] .................... H01L 29/06; H01L 31/0256; H01L 39/22
[52] U.S. Cl. .................... 257/33; 257/31; 257/32; 257/645; 423/263; 423/593; 505/238; 505/239
[58] Field of Search ............................ 423/263, 593; 257/31–33, 645; 505/238, 239

[56] References Cited

U.S. PATENT DOCUMENTS 5,814,584  9/1998  Tauber et al. ........................ 505/238

OTHER PUBLICATIONS

A. Tauber, et al, abstract entitled "$Sr_2ReSbO_6$; Re=Rare Earth, Barrier/Dielectric Layers and Substrates for Thin Film High $T_c$ Superconductors for Microwave Applications," published in Abstracts of Materials Research Society 1994 Fall Meeting, p. 292, Nov. 27–Dec. 02, 1994, Boston, Massachusetts.

S.C. Tidrow et al., "HTSC Substrate and Buffer Compounds, $A_2MeSbO_6$ Where A=Ba, Sr and Me=Sc, In and Ga," published in *Physica C*, presented at 1995 Material Research Society's Spring Meeting held in San Francisco, California; Sep. 1995.

A.J. Jacobsen, et al., 30 Acta *Crystalligraphica*, 1705–1711; Dec. 1974.

J.A. Alonso, et al., 22 *Materials Research Bulletin*, 69–74; Dec. 1987.

K.P. Reis, et.al., preprinted in Texas Center for Superconductivity at University of Houston and printed at 49 *Acta Crystalligraphica*, 1585–1588; Dec. 1993.

J.A. Alonso, et.al., 84 *Journal of Solid State Chemistry*, 16–22; Dec. 1990.

P. Woodward, et.al., 9 *Journal of Material Research*, 2118–2126; Mar. 1994.

R.D. Shannon et.al., "Dielectric constants of yttrium and rare–earth garnets, the polarizability of gallium oxide and the oxide additivity rule,"; and, Dec. 1990.

R.D. Shannon, "Dielectric polarizabilities of ions in oxides and fluorides,". Dec. 1993.

*Primary Examiner*—Mahshid Saadat
*Assistant Examiner*—Allan R. Wilson
*Attorney, Agent, or Firm*—Michael Zelenka; George B. Tereschuk

[57] ABSTRACT

Compounds of the general formula $A_4MeSb_3O_{12}$ wherein A is either barium (Ba) or strontium (Sr) and Me is an alkali metal ion selected from the group consisting of lithium (Li), sodium (Na) and potassium (K) have been prepared and included in high critical temperature thin film superconductors, ferroelectrics, pyroelectrics, piezoelectrics, and hybrid device structures.

16 Claims, No Drawings ined. The inventors herein have made different findings.
$A_4MESB_3O_{12}$ SUBSTRATES AND DIELECTRIC/BUFFER LAYERS FOR GROWTH OF EPITAXIAL HTSC/PEROVSKITE OXIDE FILMS FOR USE IN HTSC/PEROVSKITE OXIDE DEVICES AND MICROWAVE DEVICE STRUCTURES

CONTINUATION IN PART

This application is a continuation in part of U.S. Patent and Trademark Office application Ser. No. 08/752,511, originally entitled, "Substrate and Buffer Layer Compounds For Epitaxial HTSC Film Growth," filed on Nov. 20, 1996, designated as, now abandoned. This continuation in part is being filed under 37 CFR. § 1.53.

GOVERNMENT INTEREST

The invention described herein may be manufactured, used, and licensed by or for the Government for governmental purposes without the payment to us of any royalties thereon.

RELATED APPLICATION

CECOM Docket No. 5433, assigned U.S. patent Office application Ser. No. 09/337,724, entitled "Rare Earth Metal Compounds For Use In High Critical Temperature Thin Film Superconductors, Ferroelectrics, Pyroelectrics, Piezoelectrics, and Hybrids," and CECOM Docket No. 5151, assigned U.S. patent Office application Ser. No. 08/502,739, entitled "Compounds in the Series $A_2MeSbO_6$ for Use as Substrates, Barrier-Dielectric Layers and Passivating Layers in High Critical Temperature Superconducting Devices," which have both been partially assigned to the same assignee, have been filed in the United States patent and Trademark Office and are related to this application. U.S. Patent Office application Ser. No. 08/502,739 was issued as U.S. Pat. No. 5,814,584 on Apr. 29, 1998, and is incorporated herein by reference.

FIELD OF INVENTION

The invention relates in general to dielectric substrates and barriers to be used in High Critical Temperature Superconducting microwave and millimeterwave devices, and in particular to new and useful compounds of the general formula $A_4MeSb_3O_{12}$ where A is either barium (Ba) or strontium (Sr) and Me is an alkali metal ion selected from the group consisting of lithium (Li), sodium (Na) and potassium (K).

BACKGROUND OF THE INVENTION

Heretofore, the best superconducting electronic devices have been fabricated as thin film epitaxial structures deposited on dielectric substrates or buffer layers, and the best substrate or barrier dielectric in thin film superconductor technology has been $LaAlO_3$. Dielectric substrates and buffer layers for microwave devices and growth of high quality HSTC films must meet stringent requirements, including being a member of a cubic crystal system, exhibiting no twinning or strain and a close fit to the HTSC lattice parameters. They must also have a comparable temperature coefficient of expansion; a low isotropic dielectric constant; a low dielectric loss and no chemical reaction with HTSC and they must be mechanically strong. There have been problems with the use of $LaAlO_3$. For one, its dielectric constant is too high, meaning that at high frequencies device features become unmanageably small. Another drawback of $LaAlO_3$ is its anisotropic dielectric constant which creates very difficult device fabrication. It also undergoes a phase transition leading to twinning and stress.

Many of these problems were overcome by the above-referenced CECOM Docket No. 5433, but the rare earth metal compounds of that invention are magnetic, particularly at low temperatures, and losses may arise from the use of rare earth metals in those compounds. Magnetic losses were overcome by the above-referenced U.S. Pat. No. 5,814,584 which also disclosed lattice parameters in the $A_2MeSbO_6$ compounds that provided a comparable or better fit to $YBa_2Cu_3O_{7-\delta}$ (YBCO) than the compounds disclosed in CECOM Docket No. 5433.

One unsolved problem remains ionic diffusion, which can occur across the boundary between the substrate/barrier and the YBCO, scandium (Sc), indium (In) and gallium (Ga) compounds disclosed in U.S. Pat. No. 5,814,584, issued on Apr. 29, 1998, which may diffuse across and substitute for copper ($Cu^{2+}$). This diffusion will reduce both the critical temperature, or $T_c$, and the critical current density, or $J_c$, while increasing the surface resistance, or $R_s$, all of which are detrimental to microwave device operation. In order to overcome the drawbacks and limitations of past devices utilizing $LaAlO_3$ or MgO substrates and buffered YSZ or sapphire, as well as the tendency for ions to diffuse across the boundary between the substrate/barrier and the YBCO, antimonates with ordered perovskite structures have been investigated because these materials provide a relatively low dielectric loss of approximately $1\times10^{-3}$ and provide isotropic dielectric constants. The term "low dielectric loss," as used throughout this disclosure, is defined as any dielectric loss lower than $1\times10^{-2}$. The term "low dielectric constant," as used throughout this disclosure, is defined as any dielectric constant lower than 26, and, in this invention ranges from 9–16.2, within an experimental error of +/−5%.

The present invention solves the barrier diffusion problem by deposition of thin film compounds by pulsed laser deposition in the system $A_4MeSb_3O_{12}$ where A is either barium (Ba) or strontium (Sr) and Me is an alkali metal ion selected from the group consisting of lithium (Li), sodium (Na) and potassium (K) in which these ions may diffuse across the substrate/film interface without adversely impacting the $T_c$ and $J_c$ characteristics, without the drawbacks and limitations of previous compounds. The ions of the compounds of the present invention may also diffuse across the interface between the substrate/barrier and YBCO, except that these ions, depending upon which YBCO ions they substitute for, may increase $T_c$ and $J_c$ for small concentrations, and suffer from none of the disadvantages and drawbacks of the compounds utilizing $LaAlO_3$ or MgO substrates and buffered YSZ or sapphire.

Crystal structures of the compounds in the system $Ba_4MeSb_3O_{12}$, where Me is Li and Na have been previously determined by x-ray and neutron diffraction and both of these compounds were found to be cubic, to belong to space group Im3m, to be perovskites and to exhibit an Me:Sb ordering of 1:3 on B sites. Also, $Sr_4NaSb_3O_{12}$ has been reported in the literature as being monoclinic space group $P2_1/n$ as determined from x-ray and neutron diffraction studies. The inventors herein have made different findings. Further, the prior art does not disclose uses of these compounds in HTSC and hybrid microwave devices made herein.

The following references and publications, describe the prior art in this area:

A. Tauber, et. al., abstract entitled "$Sr_2ReSbO_6$; Re=Rare Earth, Barrier/Dielectric Layers and Substrates for Thin Film High $T_c$ Superconductors for Microwave Applications," published in Abstracts of Materials Research Society 1994 Fall Meeting, p.292, Nov. 27–Dec. 2, 1994, Boston, Mass.;

S. C. Tidrow, et. al., paper entitled "HTSC Substrate and Buffer Compounds, $A_2MeSbO_6$ Where A=Ba, Sr and Me=Sc, In and Ga," published in *Physica C*, presented at 1995 Material Research Society's Spring Meeting held in San Francisco, Calif.;

A. J. Jacobsen, et. al., 30 *Acta Crystalligrahica*, 1705–1711 (1974);

J. A. Alonso, et. al., 22 *Materials Research Bulletin*, 69–74 (1987);

K. P. Reis, et. al., preprinted in Texas Center for Superconductivity at University of Houston and printed at 49 *Acta Crystalligrahica*, 1585–1588 (1993);

J. A. Alonso, et. al., 84 *Journal of Solid State Chemistry*, 16–22 (1990);

P. Woodward, et. al., 9 *Journal of Material Research*, 2118–2126 (1994);

R. D. Shannon et al "Dielectric constants of yttrium and rare-earth garnets, the polarizability of gallium oxide and the oxide additivity rule," (1990); and R. D. Shannon "Dielectric polarizabilities of ions in oxides and fluorides," (1993).

SUMMARY OF THE INVENTION

The general object of this invention is to provide materials that can be used as a substrate or barrier dielectric in thin film superconductor technology that can overcome the shortcomings of $LaAlO_3$. A more particular object of the invention is to provide a substrate or barrier dielectric with a low dielectric constant, a low dielectric loss and a material that does not undergo a phase transition that leads to twinning and stress. A further object of this invention is to provide compounds having alkali metal ions which will possess none of the disadvantages of utilizing rare earth metal which can have magnetic losses at low temperature. In addition, alkali metal ions may diffuse across the interface between the substrate/barrier and the YBCO with no detrimental effect on, or may slightly increase, $T_c$ and $J_c$ for small concentrations, depending upon the crystallographic sites to which the ions diffuse.

It has now been found that the aforementioned objects can be attained using a compound of the general formula $A_4MeSb_3O_{12}$ as the substrate or barrier dielectric in thin film superconductor technology. In the above formula, A can be either barium (Ba) or strontium (Sr) and Me is an alkali metal ion selected from the group consisting of lithium (Li), sodium (Na) and potassium (K). These compounds can be used as barrier or buffer layers and substrates in thin film high critical temperature superconducting structures. No drawings are provided for this invention.

DESCRIPTION OF THE PREFERRED EMBODIMENT

The following compounds in the series $A_4MeSb_3O_{12}$ have been synthesized for use as dielectric substrates, barrier layers or passivation layers in thin film high critical temperature superconductor structures: $Sr_4NaSb_3O_{12}$, $Sr_4KSb_3O_{12}$, $Ba_4LiSb_3O_{12}$ and $Ba_4NaSb_3O_{12}$.

The bulk compounds $Sr_4NaSb_3O_{12}$, $Sr_4KSb_3O_{12}$, $Ba_4LiSb_3O_{12}$ and $Ba_4NaSb_3O_{12}$ were prepared by solid state reaction between reagent grade $BaCO_3$, $SrCO_3$, $Li_2CO_3$, $Na_2CO_3$, $K_2CO_3$ and $Sb_2O_3$ by reacting intimate mixtures of stoichiometric amounts of each. Components were ground together in a mortar, the resulting mixture was pressed into disks and heated to 1100° C., at a rate of 180° C. per hour, for 15 hours in air and cooled to 100° C. at the same rate and removed from the furnace. The disks were reground to a powder with a particle size of 100 μm or less, pressed into disks of about 1.25 inches in diameter, with a thickness of between 0.125 and 0.25 inches in a steel die, then isostatically repressed at 60,000 psi, sintered at 1450°–1600° C. for 20–50 hours, cooled to 100° C. and removed from the furnace. After sintering, the disks were about 1 inch in diameter. Lattice parameters were obtained from diffractometer scans taken between 15–155° 2θ using CuKα radiation, where λ=1.54056 Å, using a least squares fit to the Nelson-Riley function for the last 15 diffraction peaks.

Density measurements were obtained with a helium gas pyncometer on sintered bulk disks. The prior art discloses earlier efforts preparing these compounds by firing samples between 1000° and 1400° C. The inventors herein found that sintering temperatures between 1450° and 1600° C. for 20–50 hours were required to achieve the type of very dense samples essential for complex dielectric measurements. TABLE I, below, compares experimental densities with x-ray densities.

It is important to note the significant relationship between the higher temperatures of 1450° and 1600° C. for 20–50 hours and the densities attained with these materials. The papers "Dielectric constants of yttrium and rare-earth garnets, the polarizability of gallium oxide and the oxide additivity rule," by R. D. Shannon et al. and "Dielectric polarizabilities of ions in oxides and fluorides," by R. D. Shannon established that the dielectric constant of a well-behaved complex oxide can be predicted by knowing the polarizability of the atoms making up the structure and the volume of the structure. From these relationships it is straightforward to understand that the dielectric constant of a material is sensitive to the sample's density. For instance, the more porous the sample (i.e. less dense), the lower the dielectric constant will be (air has a dielectric constant of roughly 1.00 for a sample density approaching 0%). When comparing two samples of the same compound with equivalent densities, e.g. both 100% dense, the same dielectric constant would be expected. However, when comparing two material samples with different densities and the same lattice parameter, the dielectric constant measurements can be appreciably different, again dependent on the difference in sample density.

Further, the polarizability of $Sb^{5+}$, which is a constituent atom of the materials used to fabricate the compounds and devices of the present invention, has not been previously known. The materials of the present invention all include at least one $Sb^{5+}$ constituent atom with a polarizability of about 1.2 Å$^3$. Therefore, prior art references that do not account for significant factors such as polarizability and material density have not predicted the advantageous dielectric constants of the materials of the present invention.

All of the barium compounds were cream in color as previously reported in the prior art. X-ray diffraction patterns were indexed as body centered cubic consistent with the literature and lattice parameters also agreed with the literature. $Sr_4NaSb_3O_{12}$ was also found to be cream colored. An x-ray diffraction powder pattern was indexed as face centered cubic. The prior art description of $A_2M^{3+}M^{5+}O_6$ as having face centered cubic perovskites reported a subcell based on hkl reflections being all even and a supercell based on hkl as all odd reflections arising as a consequence of long range order. The inventors herein observed a similar subcell and supercell in $Sr_4NaSb_3O_{12}$, and as observed in prior art by Woodward et. al., the lattice parameter for the supercell is smaller than that of the subcell. Intensities of the supercell's diffraction peaks were observed as much weaker than those of the subcell.

TABLE I

PROPERTIES OF $A_4MeSb_3O_{12}$ COMPOUNDS

| COMPOUND | SINTER TEMP. ° C. | LATTICE PARAMETER A | | DENSITY g/cm³ | | DIELECTRIC CONST | LOSS 10⁻³ |
|---|---|---|---|---|---|---|---|
| | | Measured | Literature | X-RAY | exp. | | |
| $Sr_4NaSb_3O_{12}$ | 1600 | 8.180 | 8.0972* (a = 8.0913) (b = 8.0871) (c = 8.0918) (β = 89.953) | 5.52 | 5.60 | 11.5 | 9.0 |
| $Sr_4KSb_3O_{12}$ | 1450 | 8.231! | | | 6.72 | 9.0 | 2.5 |
| $Ba_4LiSb_3O_{12}$ | 1450 | 8.221 | 8.217** | 6.65 | 6.62 | 16.2 | 0.5 |
| $Ba_4NaSb_3O_{12}$ | 1450 | 8.275 | 8.273(4)*** | 6.62 | 6.64 | 14.4 | 0.6 |

*J. A. Alonso, et. al., 84 Journal of Solid State Chemistry, 16–22 (1990);
!pseudo-cubic
**A. J. Jacobsen, et. al., 30 Acta Crystalligrahica, 1705–1711 (1974); and
***K. P. Reis, et. al., 49 Acta Crystalligrahica, 1585–1588 (1993);

Microwave measurements of the real and imaginary parts of the dielectric constant were performed at approximately 9.32 and 10.1 GHz and room temperature. A cavity perturbation technique was used with a reflection-type rectangular cavity excited in either the $TE_{106}$ mode for 9.3 GHz or the $TE_{107}$ mode for 10.1 GHz. The cavity was coupled to the waveguide by an adjustable iris. A 0.5 mm by 35 mm slot cut along the center of one of the broad sides of the cavity provide access for the thin rectangular samples. The samples were held, such that their long dimension was parallel to the E field of the cavity. The samples were positioned at the E field maximum, as determined by maximizing the shift of the cavity.

The dielectric constant and dielectric loss values reported in TABLE I, above, are based on dense (about 100% theoretical density) samples made in bulk form and the inventors herein have listed the most probable value for a particular bulk compound. Accordingly, lower bulk compound readings are possible for lower density samples. Also, while dielectric constants for thin films are generally similar to the bulk values, factors such as density differences between bulk and thin film samples can cause differences in reported dielectric constants with thin films typically having lower dielectric values than dense bulk samples. Based on an experimental error of +/−5%, the following thin film dielectric constant values are expected: 10.93–12.08 for $Sr_4NaSb_3O_{12}$; 8.55–9.45 for $Sr_4KSb_3O_{12}$; 15.39–17.01 for $Ba_4LiSb_3O_{12}$; and 13.68–15.12 for $Ba_4NaSb_3O_{12}$. The thin film values for dielectric losses in the $Sr_4NaSb_3O_{12}$, $Sr_4KSb_3O_{12}$, $Ba_4LiSb_3O_{12}$ and $Ba_4NaSb_3O_{12}$ compounds are expected to be equivalent to the TABLE I empirical bulk values reported above.

The real part of the dielectric constant is calculated from the shift in the resonance frequency of the cavity due to the sample, and the loss tangent is calculated from a change in the cavity Q. The accuracy of these measurements depends upon two general sources of error:

(1) the accuracy of the cavity characterization, and (2) the material properties such as density and uniformity of shape.

The error due to cavity characterization results in an accuracy of +/−2% for the real part of the dielectric constant and limits the resolution of the loss tangent (the imaginary component divided by the real component of the loss tangent) to approximately 0.001. The error due to material properties such as sample shape and material density can be considerably greater than the cavity characterization error. However, most sample densities were near 100% of the theoretical density and thus should not introduce a large error.

The sintered disks were also employed as targets for deposition of thin films by the pulsed laser deposition ("PLD") technique, with deposition parameters of KrF excimer laser, where λ=248 nm, employing a pulse repetition rate of 10 Hz and a laser fluence of 1–2 J/cm² at the target. Other deposition parameters for each sample are set forth in TABLE II, below.

TABLE II

SUBSTRATE CONDITIONS

| COMPOUNDS | OXYGEN PRESSURE (m Torr) | HEATER BLOCK TEMP. (° C.) |
|---|---|---|
| $Sr_4NaSb_3O_{12}$ | 80 | 720 |
| $Sr_4KSb_3O_{12}$ | 170 | 800 |
| $Ba_4LiSb_3O_{12}$ | 170 | 800 |
| $Ba_4NaSb_3O_{12}$ | 80 | 720 |

Analysis of X-ray diffraction data obtained from single layer films of $A_4MeSb_3O_{12}$ on YBCO(001)/(100)Mgo reveals a predominantly epitaxial relationship as follows: $A_4MeSb_3O_{12}$ (h00)/YBCO(001)/MgO(100). A second, weaker relationship is also depicted in TABLE III below as follows: $A_4MeSb_3O_{12}$ (hh0)/YBCO(001)/(100)MgO also being present.

TABLE III

OBSERVED X-RAY REFLECTIONS

| STRUCTURE | MgO | YBCO | $A_4MeSb_3O_{12}$ | INTENSITY |
|---|---|---|---|---|
| $Sr_4KSb_3O_{12}$/MgO | | | 200 | very weak |
| | | | 220 | very strong |
| | | | 222 | very weak |
| | 200 | | | weak |
| | | | 440 | medium |
| | | | 444 | very weak |
| $Sr_4NaSb_3O_{12}$/YBCO/MgO | | 002 | | weak |
| | | | 200 | weak |
| | | 003 | | medium |
| | | | 220 | very weak |
| | | 005 | | strong |
| | | | 400 | very strong |
| | | 006 | | strong |
| | | 007 | | very weak |
| $Sr_4KSb_3O_{12}$/YBCO/MgO | | | 002 | strong |
| | | 003 | | medium |
| | | | 220 | weak |
| | | 005 | | strong |
| | 200 | | | very strong |
| | | | 400 | very strong |
| | | 006 | | strong |
| | | | 422 | very weak |
| | | 007 | | weak |
| | | 008 | | very weak |
| | | | 422/600 | very weak |
| | | 009 | | very weak |
| | | 0010 | | very weak |
| | | | 800 | very weak |
| $Ba_4NaSb_3O_{12}$/YBCO/MgO | | | 110 | weak |
| | | 002 | | medium |
| | | | 200 | medium |
| | | 003 | | medium |
| | | | 200 | weak |
| | | 005 | | medium |
| | 200 | | | strong |
| | | 006 | | medium |
| | | 007 | | medium |
| | | 008 | | very weak |
| | | 009 | | very weak |
| $Ba_4LiSb_3O_{12}$/YBCO/MgO | | | 200 | very weak |
| | | 300 | | weak |
| | | 111 | | very weak |
| | | | 211 | very weak |
| | | | 220 | very weak |
| | | 005 | | strong |
| | | | 400 | very strong |
| | 200 | | | very strong |
| | | 006 | | very strong |
| | | 007 | | medium |
| | | 008 | | weak |
| | | 009 | | weak |
| | | | 622 | weak |
| | | 0010 | | weak |
| | | 0011 | | weak |

$Sr_4KSb_3O_{12}$ is not cubic. However, thin films prepared by pulse laser ablation deposition were highly oriented exhibiting the relationship of $Sr_4KSb_3O_{12}$ (220)/MgO (100). The observed bulk dielectric constant and loss were found to be in the same range as other antiomonates previously investigated and reported, set forth in TABLE I, above.

Considering the following tolerance factor:

$$t = \frac{(r_A + r_o)}{\sqrt{2}\,(r_B + r_o)}$$

where $r_A$ and $r_B$ are the radii of the A and B ions, for both barium (Ba) compounds $Ba_4LiSb_3O_{12}$ and $Ba_4NaSb_3O_{12}$, and $r_o$ is the radius of oxygen ions, the ratios are about 1 or greater with ratios of between 1.0 and 0.9 for the two strontium (Sr) compounds $Sr_4NaSb3O_{12}$ and $Sr_4KSb_3O_{12}$ of the present invention. Anticipated distortion from the cubic system did not occur until the alkali metal potassium (K) was used. The difference in charge between B site ions is $4^+$ which is a major driving force for ordering as predicted in the literature. $Sr_4NaSb_3O_{12}$ crystallizes as a monoclinic phase when prepared between 680° and 940° C. Analysis of x-ray data suggests a cubic body centered structure. It appears contradictory that $Sr_4NaSb_3O_{12}$ crystallizes with a cubic face centered structure when prepared above 1450° C., yet $Ba_4NaSb_3O_{12}$, prepared at the same temperature, crystallizes with a body centered structure similar to the low temperature form of $Sr_4NaSb_3O_{12}$. This can, however, be explained by comparing the size of the $Ba^{2+}$ and $Sr^{2+}$ ionic radii. Since $Sr^{2+}$ is smaller, the B—B distances are more compressed, thereby changing the ordering energy of $Me^{1+}$ and $Sb^{5+}$ which accounts for the difference.

$A_4MeSb_3O_{12}$ compounds provide a significant advantage over other antimonates previously disclosed. While $Sr_2GaSbO_6$ and $Sr_2ScSbO_6$ provided a better lattice match to YBCO, the $A_4MeSb_3O_{12}$ compounds where Me=alkali metal ions lithium (Li), sodium (Na) and potassium (K) disclosed herein, afford better chemistry in that they improve the properties of the superconductors as a result of diffusion of small quantities of alkali metal ions. In either case, diffusion of B site ions across the substrate/buffer layer interface will lead to substitution in YBCO films. In the case of scandium (Sc) and gallium (Ga), this results in a reduction of $T_c$ when they substitute for copper (Cu). However, alkali metal ions lithium (Li), sodium (Na) and potassium (K) have all been reported to have no effect or increase $T_c$ and $J_c$, when present in small concentrations, depending upon the substituent site.

In this disclosure, the term "by bulk" means dense sintered polycrystalline bodies from 1 to 1.25 inches in diameter and about 0.125 to 0.25 inches in thickness. X-ray diffractometer spectra were recorded to confirm that each disk is single phase in composition. Lattice parameters are determined from the indexed powder pattern and are listed in TABLE I. In all instances, the resulting compounds formed have the perovskite structure. Therefore, $Sr_4KSb_3O_{12}$ is considered a new constitution of matter because this specification describes how to prepare this compound, which has never been reported in the literature before. Some of the properties of this compound are set forth in TABLE I, above.

The properties and test data of the compounds of the present invention disclose parameter fits that are superior to the rare earth metal compounds described in the above-referenced CECOM Docket No. 5433 patent application. Additionally, all compounds disclosed in this invention are superior to the previously disclosed compounds because these compounds do not contain magnetic ions. Generally, magnetic ions can contribute to dielectric loss at low temperature.

In the foregoing disclosure, the term "high critical temperature thin film superconductor device" means a copper oxide superconductor having a critical temperature in excess of 30° K. Such thin film high $T_c$ superconductor devices, or structures, may include arrangements where materials of the compounds of the present invention in various forms are advantageously interspersed with a layer constructed of a high $T_c$ superconductive material. In such an arrangement, the materials disclosed herein can be stacked in a number of different configurations. Examples of such superconductors are: $REBa_2Cu_3O_{7-\delta}$, $REBa_2Cu_4O_8$ where RE is a rare earth element and $0 \leq \delta \leq 1$, $Tl_2Ca_2Ba_2Cu_3O_{10}$, $Tl_1Ca_2Ba_2Cu_3O_9$ and $Tl_2Ba_2Ca_1Cu_2O_8$ and the series containing Hg compounds: $HgBa_2Ca_{n-1}Cu_nO_{2+2n+x}$ $1 \leq n \leq 6$, $HgSr_2Ca_{n-1}Cu_nO_{2+2n+y}$ $1 \leq n \leq 6$ $HgSr_2Cu(Me)O_y$ where Me=Cr, Mo, Re, Y and $Hg_{1-x}M_xBa_2Ca_{n-1}Cu_nO_{2n+1}$ where M=Bi, Pb, rare earth $1 \leq m \leq 6$.

The term "single layer device" refers to a device including a single layer of a high critical temperature superconducting, ferroelectric, pyroeletric, piezoelectric, or ferromagnetic material. The term "multilayer device" refers to a device including at least two layers of a high critical temperature superconductor, ferroelectric, pyroeletric, piezoelectric, dielectric or ferromagnetic layers.

High critical temperature superconducting, dielectric, ferroelectric, pyroelectric, piezoelectric, and ferromagnetic materials and the compounds of this invention can be used in devices including flux flow transistors, current limiters, broadband impedance transformers, diodes, delay lines, resonators, antenna, antenna feeds, switches, phase shifters, mixers, amplifiers, bolometers and magneto-resistors.

The compounds of the invention can be made in the form of a bulk single crystal substrate, a dense polycrystalline disc, a crystalline expitaxial thin film or a polycrystalline thin film. In the manufacture of thin film devices containing these compounds, some form of laser ablation is preferred, but the thin film compounds can also be made by techniques such as sputtering, MOCVD, MBE, evaporation, and so on. The compounds of the present invention can be used in bulk form to serve as targets for the deposition of thin films by such methods as sputtering or laser ablation. The thin films may serve as dielectric buffer layers or dielectric substrates in single and multilayer structures. As single crystals, the compounds of this invention can be used as bulk substrates.

The following examples illustrate a number of uses of the $A_4MeSb_3O_{12}$ compounds of this invention.

An antenna can be made according to the invention by depositing a single layer of high critical temperature superconductor (HTSC) directly onto a single crystal of a $Sr_4NaSb_3O_{12}$, $Sr_4KSb_3O_{12}$, $Ba_4LiSb_3O_{12}$ or $Ba_4NaSb_3O_{12}$ substrate, or a substrate buffered with a layer of any of the $A_4MeSb_3O_{12}$ compounds disclosed herein. The HTSC is then patterned to complete the device.

A superconductor insulator superconductor step edge Josephson junction, which is a multilayer superconducting device, is fabricated according to the present invention using any of the $A_4MeSb_3O_{12}$ compounds disclosed herein: $Sr_4NaSb_3O_{12}$, $Sr_4KSb_3O_{12}$, $Ba_4LiSb_3O_{12}$ or $Ba_4NaSb_3O_{12}$. More particularly, the device is made by depositing a single layer of HTSC on a single crystal of either $Sr_4NaSb_3O_{12}$, $Sr_4KSb_3O_{12}$, $Ba_4LiSb_3O_{12}$, or $Ba_4NaSb_3O_{12}$ substrate or a substrate of other composition buffered with a layer of the $A_4MeSb_3O_{12}$ compounds disclosed herein. Next, the HTSC is patterned by ion milling at a 45° angle. A layer of $Sr_4NaSb_3O_{12}$, $Sr_4KSb_3O_{12}$, $Ba_4LiSb_3O_{12}$, or $Ba_4NaSb_3O_{12}$ is then deposited. Next, another HTSC layer is deposited and patterned to complete the device.

We wish it to be understood that we do not desire to be limited to the exact details of construction shown and described for obvious modifications will occur to a person skilled in the art.

What we claim is:

1. A dielectric substrate having the general formula $A_4MeSb_3O_{12}$ where A is barium and Me is an alkali metal ion selected from the group consisting of lithium and sodium, comprising:

said dielectric substrate being sintered at temperatures between 1450° C. and 1600° C. for 20–50 hours;

said general formula including an $Sb^{+5}$ constituent atom having a polarizability of about 1.2 Å$^3$;

said dielectric substrate having a low dielectric constant in the range of 13.68 to 17.01;

said dielectric substrate having a low dielectric loss of no more than $0.6 \times 10^{-6}$ without a phase transition;

whereby when a thin film is deposited on said dielectric substrate, a substrate-film interface is formed between said dielectric substrate and said thin film; and said dielectric substrate having a plurality of ions to diffuse across said substrate-film interface without adversely impacting a plurality of $T_c$ and $J_c$ characteristics.

2. The dielectric substrate according to claim 1, wherein:

said dielectric substrate is constructed of $Ba_4LiSb_3O_{12}$ in bulk form;

said dielectric substrate having a material density of about 6.65 g/cm$^3$;

said dielectric substrate having a low dielectric constant of about 16.2; and said dielectric substrate having a low dielectric loss of about $0.5 \times 10^{-3}$.

3. The dielectric substrate according to claim 2, wherein:

said dielectric substrate is constructed in a thin film structure; and said dielectric substrate having a low dielectric constant in the range of 15.39 to 17.01.

4. The dielectric-substrate according to claim 1, wherein:

said dielectric substrate is constructed of $Ba_4NaSb_3O_{12}$ in bulk form;

said dielectric substrate having a material density of about 6.64 g/cm$^3$;

said dielectric substrate having a low dielectric constant of about 14.4; and said dielectric substrate having a low dielectric loss of about $0.6 \times 10^{-3}$.

5. The dielectric substrate according to claim 4, wherein:

said dielectric substrate is constructed in a thin film structure; and said dielectric substrate having a low dielectric constant in the range of 13.68 to 15.12.

6. A dielectric substrate having the general formula $A_4MeSb_3O_{12}$ where A is strontium and Me is an alkali metal ion selected from the group consisting of sodium and potassium, comprising:

said dielectric substrate being sintered at temperatures between 1450° C. and 1600° C. for 20–50 hours;

said general formula including an $Sb^{+5}$ constituent atom having a polarizability of about 1.2 Å$^3$;

said dielectric substrate having a low dielectric constant in the range of 8.55 to 12.08;

said dielectric substrate having a low dielectric loss of no more than $9.0 \times 10^{-3}$ without a phase transition;

whereby when a thin film is deposited on said dielectric substrate, a substrate-film interface is formed between said dielectric substrate and said thin film; and said dielectric substrate having a plurality of ions to diffuse across said substrate-film interface without adversely impacting a plurality of $T_c$ and $J_c$ characteristics.

7. The dielectric substrate according to claim 6, wherein:

said dielectric substrate is constructed of $Sr_4KSb_3O_{12}$ in bulk form;

said dielectric substrate having a material density of about 6.72 g/cm$^3$;

said dielectric substrate having a low dielectric constant of about 9.0; and said dielectric substrate having a low dielectric loss of about $2.5 \times 10^{-3}$.

8. The dielectric substrate according to claim 7, wherein:

said dielectric substrate is constructed in a thin film structure; and said dielectric substrate having a low dielectric constant in the range of 8.55 to 9.45.

9. The dielectric substrate according to claim 6, wherein:

said dielectric substrate is constructed of $Sr_4NaSb_3O_{12}$ in bulk form;

said dielectric constant having a lattice parameter of about 8.180 Å;

said dielectric substrate having a material density of about 5.60 $g/cm^3$;

said dielectric substrate having a low dielectric constant of about 11.5; and said dielectric substrate having a low dielectric loss of about $9.0 \times 10^{-3}$.

10. The dielectric substrate according to claim 9, wherein:

said dielectric substrate is constructed in a thin film structure; and said dielectric substrate having a low dielectric constant in the range of 10.925 to 12.075.

11. A buffer layer having the general formula $A_4MeSb_3O_{12}$ where A is barium and Me is an alkali metal ion selected from the group consisting of lithium and sodium, comprising:

said buffer layer being sintered at temperatures between 1450° C. and 1600° C. for about 20–50 hours;

said general formula including an $Sb^{+5}$ constituent atom having a polarizability of about 1.2 $Å^3$;

said buffer layer having a low dielectric constant in the range of 13.68 to 17.01;

said buffer layer having a low dielectric loss of no more than $0.6 \times 10^{-3}$ without a phase transition;

whereby when a thin film is deposited on said buffer layer, a substrate-film interface is formed between said buffer layer and said thin film; and said buffer layer having a plurality of ions to diffuse across said substrate-film interface without adversely impacting a plurality of $T_c$ and $J_c$ characteristics.

12. The buffer layer according to claim 11, wherein:

said buffer layer is constructed of $Ba_4LiSb_3O_{12}$ in a thin film structure;

said buffer layer having a material density of about 6.62 $g/cm^3$;

said buffer layer having a low dielectric constant in the range of 15.39 to 17.01; and said buffer layer having a low dielectric loss of about $0.5 \times 10^{-3}$.

13. The buffer layer according to claim 11, wherein:

said buffer layer is constructed of $Ba_4NaSb_3O_{12}$ in a thin film structure;

said buffer layer having a material density of 6.64 $g/cm^3$;

said buffer layer having a low dielectric constant in the range of 13.68 to 15.12; and said buffer layer having a low dielectric loss of about $0.6 \times 10^{-3}$.

14. A buffer layer having the general formula $A_4MeSb_3O_{12}$ where A is strontium and Me is an alkali metal ion selected from the group consisting of sodium and potassium, comprising:

said buffer layer being sintered at temperatures between 1450° C. and 1600° C. for 20–50 hours;

said general formula including an $Sb^{+5}$ constituent atom having a polarizability of about 1.2 $Å^3$;

said buffer layer having a low dielectric constant in the range of 8.55 to 12.08;

said buffer layer having a low dielectric loss of no more than $9.0 \times 10^{-3}$ without a phase transition;

whereby when a thin film is deposited on said buffer layer, a substrate-film interface is formed between said dielectric substrate and said thin film; and said dielectric substrate having a plurality of ions to diffuse across said substrate-film interface without adversely impacting a plurality of $T_c$ and $J_c$ characteristics.

15. The buffer layer according to claim 14, wherein:

said buffer layer is constructed of $Sr_4KSb_3O_{12}$ in a thin film structure;

said buffer layer having a material density of 6.72 $g/cm^3$;

said buffer layer having a low dielectric constant in the range of 8.55 to 9.45; and said buffer layer having a low dielectric loss of about $2.5 \times 10^{-3}$.

16. The buffer layer according to claim 14, wherein:

said buffer layer is constructed of $Sr_4NaSb_3O_{12}$ in a thin film structure;

said buffer layer having a material density of about 5.60 $g/cm^3$;

said buffer layer having a low dielectric constant in the range of 10.925 to 12.075; and said buffer layer having a low dielectric loss of about $9.0 \times 10^{-3}$.

* * * * *

UNITED STATES PATENT AND TRADEMARK OFFICE
CERTIFICATE OF CORRECTION

PATENT NO.     : 6,084,246
DATED          : July 4, 2000
INVENTOR(S)    : Arthur Tauber, Steven C. Tidrow, William D. Wilber and Robert D. Finnegan It is certified that error appears in the above-identified patent and that said Letters Patent is hereby corrected as shown below:

Column 1,
Line 14, insert after "designated as" -- CECOM Docket No. 5226 --;

Column 10,
Line 4, change "$0.6 \times 10^{-6}$" to read -- $0.6 \times 10^{-3}$ --;

Signed and Sealed this

Twenty-ninth Day of October, 2002

Attest:

JAMES E. ROGAN
Attesting Officer  Director of the United States Patent and Trademark Office